United States Patent [19]

Brown

[11] 4,313,358
[45] Feb. 2, 1982

[54] DYNAMICALLY BALANCED TRIM PRESS

[75] Inventor: Gaylord W. Brown, Beaverton, Mich.

[73] Assignee: Sweetheart Plastics, Inc., Wilmington, Md.

[21] Appl. No.: 73,690

[22] Filed: Sep. 10, 1979

[51] Int. Cl.³ .............................................. B26D 7/18
[52] U.S. Cl. ........................................ 83/97; 83/127; 83/164; 83/405; 83/255; 83/927
[58] Field of Search .................. 83/97, 164, 405, 127, 83/255, 923, 123, 124, 125, 103

[56] References Cited

U.S. PATENT DOCUMENTS

| | | | |
|---|---|---|---|
| 1,577,918 | 3/1926 | Luisa et al. | 83/97 |
| 1,669,164 | 5/1928 | Holman | 83/97 |
| 3,376,773 | 4/1968 | La Motte | 83/923 X |
| 3,410,161 | 11/1968 | Roch | 83/923 X |
| 3,461,760 | 8/1969 | White | 83/97 X |

Primary Examiner—Donald R. Schran
Attorney, Agent, or Firm—John J. Swartz

[57] ABSTRACT

A trim press for severing articles differentially pressure formed in a thermoplastic sheet comprising a pair of dynamically balanced trim die members mounted for movement toward and away from each other between spaced apart positions and closed positions engaging opposite sides of the sheet to sever the article from the sheet. One of the trim die members includes an opening therethrough for receiving the article as it is being trimmed and for passing the article therethrough after it is trimmed and part receiver means stationarily mounted in alignment with the opening for receiving the articles from the moving trim die member.

8 Claims, 7 Drawing Figures

DYNAMICALLY BALANCED TRIM PRESS

FIELD OF THE INVENTION

This invention relates to a trim press for severing articles from a sheet of thermoplastic material in which the articles have been differentially pressure formed and more particularly to a trim press including a stationary receiver which receives the severed articles from one of a pair of dynamically balanced, movable platens that are mounted on a frame for concurrent movement toward and away from each other between spaced apart positions and adjacent positions in which they bear against opposite sides of the sheet to sever the articles from the sheet.

BACKGROUND OF THE INVENTION

Apparatus, such as that disclosed in U.S. Pat. No. 3,664,791 granted to G. W. Brown on May 23, 1972, has been provided heretofore for successively delivering a heated thermoplastic sheet to a sheet heating station and then to a forming station at which opposed molds engage the sheet to differentially pressure form articles in the sheet. Apparatus constructed according to the present invention is particularly directed to new and novel apparatus for trimming articles, such as that disclosed in the aforementioned Brown patent, from the plastic sheet.

Prior art trim presses have included one stationary platen and one movable platen mounting opposed trim dies which engage opposite sides of the sheet to trim the article from the sheet. Such trim presses are not dynamically balanced and thus, the maximum speed of operation and output are limited. Accordingly, it is an object of the present invention to provide a new and novel trim press including dynamically balanced platens which concurrently move toward and away from each other to engage opposite sides of a sheet of thermoplastic material and sever an article formed in the sheet of material.

It is another object of the present invention to provide a trim press having an increased production rate.

It is another object of the present invention to provide a trim press having a pair of moving, dynamically balanced, trim die members and new and novel receiving apparatus for receiving the severed parts from one of the moving platens.

Another object of the present invention is to provide a new and novel trim press including a pair of dynamically balanced, movable platens, and a stationary receiver member for receiving the severed articles from one of the moving platens.

The apparatus constructed according to the present invention includes mechanism for successively indexing the plastic sheet through a trim station at which articles formed in the sheet are successively severed from the sheet, thus leaving a series of holes in the sheet which is thereafter moved downstream to a sheet severing station at which the sheet is cut into strips for scrap. Apparatus constructed according to the present invention includes a trim knife at the sheet severing station which engages the sheet, downstream of the trim station to cut the sheet into strips. If the trim knife at the sheet severing station engages the sheet at the same time that the trim die members engage the sheet at the trim station, the clamping of the sheet by the sheet severing knife at the sheet severing station will sometimes move the sheet and prevent accurate, final location of the sheet at the first trim station and thus result in inaccurate trimming of the articles. Accordingly, it is a further object of the present invention to provide cut-off knife mechanism at a sheet severing station downstream of a trim station for cutting the sheet into strips and mechanism for operating the trim knife at the sheet severing station in timed relation with operation of the trim dies at the trim station so that the trim knife engages the sheet a predetermined time after the trim dies sever the articles from the sheet at the trim station.

Other objects and advantages of the present invention will become apparent to those of ordinary skill in the art as the description thereof proceeds.

SUMMARY OF THE INVENTION

A trim press for severing articles differentially pressure formed in a sheet of thermoplastic material comprising: a frame; mechanism for successively indexing a thermoplastic sheet having a plurality of articles differentially pressure formed therein to a trim station; a pair of dynamically balanced trim die members mounted on the frame for concurrent, to-and-fro movement between spread positions and closed positions to engage opposite sides of the sheet and sever the article at the trim station from the sheet. One of the trim die members includes an internal opening therethrough for receiving the articles as they are being trimmed and for passing the articles therethrough after they are trimmed. The trim press includes article receiver mechanism, stationarily mounted on the frame and received by the opening, for receiving the trimmed articles in nested, stacked relation with previously trimmed articles.

The present invention may more readily be understood by reference to the accompanying drawings, in which.

DESCRIPTION OF THE PREFERRED EMBODIMENT GENERAL DESCRIPTION

Figure 6:
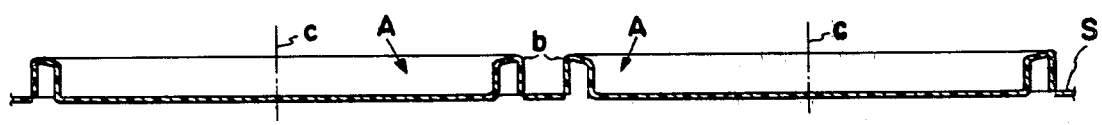
FIG. 6 is an enlarged, sectional end view more particularly illustrating a sheet of plastic having parts thermoformed therein, taken along the line 6—6 of FIG. 7.
Figure 7:
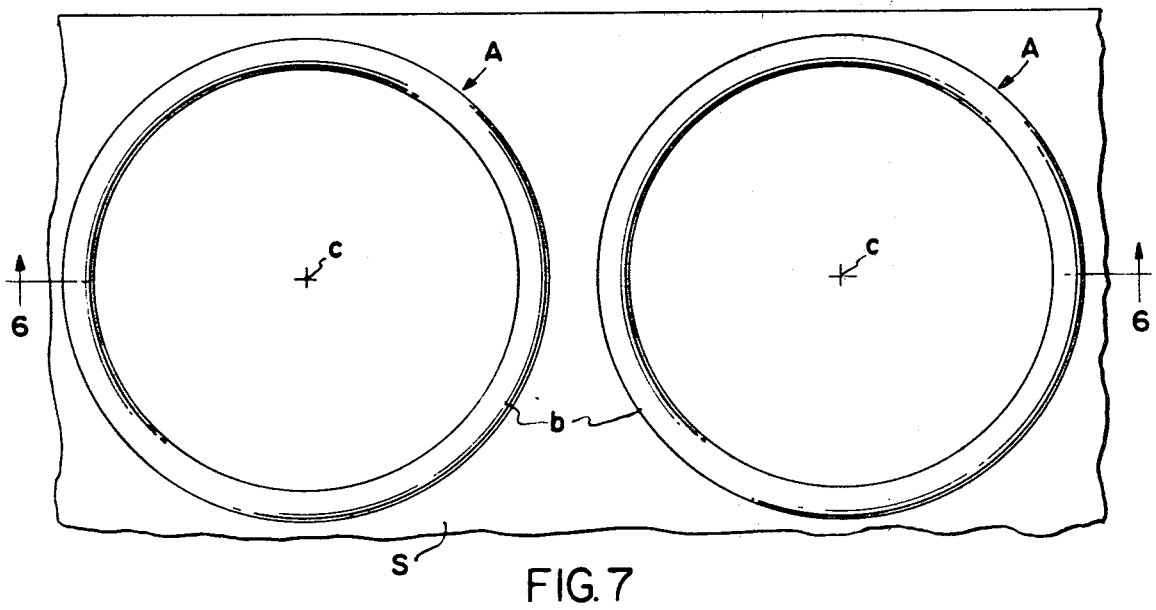
FIG. 7 is a top plan view of the sheet of thermoplastic material illustrated in FIG. 6.

Trim press apparatus constructed according to the present invention is generally designated 10 and includes a frame, generally designated F, comprising laterally spaced apart pairs of upstanding posts 12 mounting laterally spaced apart pairs of upper and lower side rails 14 and 16 spanned by transverse frame members 18, 20, and 22. The trim press 10 is particularly adapted for severing articles, generally designated A (FIGS. 6 and 7), which have been differentially pressure formed in a sheet S of thermoplastic material by thermoforming apparatus, such as that disclosed in the aforementioned U.S. Pat. No. 3,664,791, which is incorporated herein by reference. The articles A may suitably comprise thermoformed, thermoplastic lids for cups and the like conventionally used in coffee vending machines.

Figure 3:
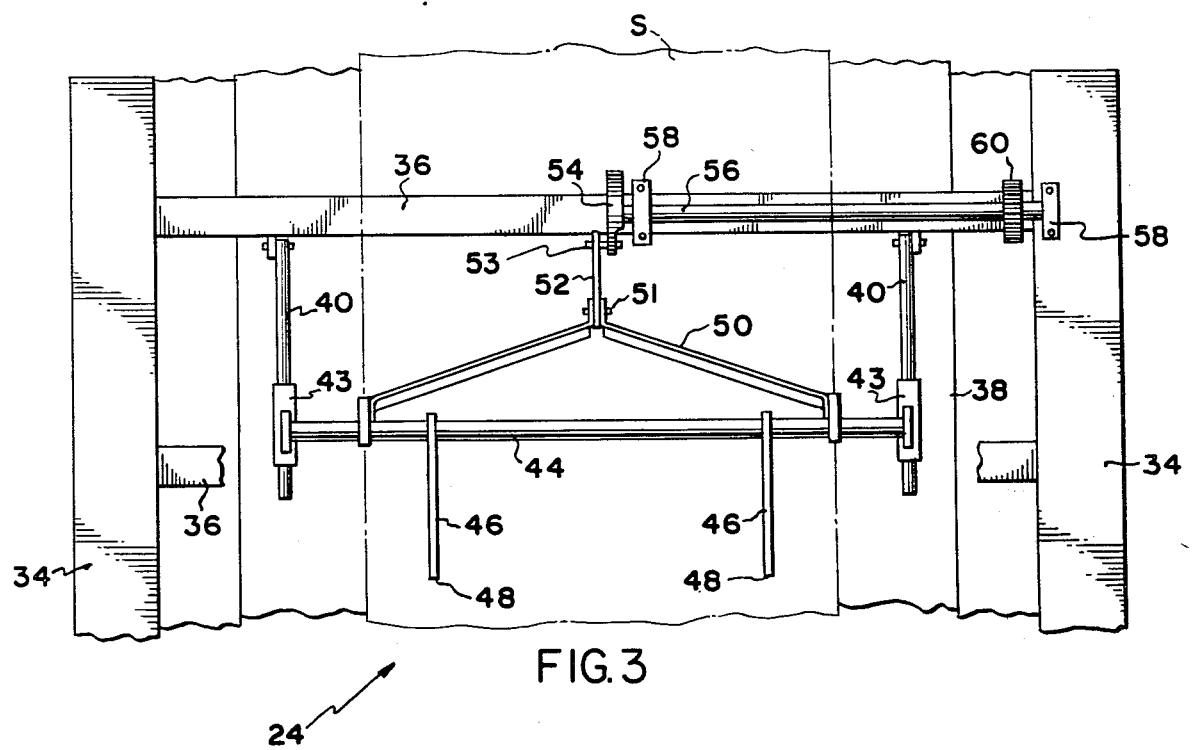
FIG. 3 is a sectional, front end elevational view, taken along the line 3—3 of FIG. 2.

The trim press 10 includes sheet feed mechanism, generally designated 24 (FIG. 3), for successively vertically downwardly indexing the sheet S to a trim station, generally designated 26, and thence downwardly to a sheet severing station, generally designated 27. A pair of opposed, dynamically balanced, primary and secondary trim die assemblies, generally designated 28 and 29, are movably mounted on the frame F for trimming the articles A from the sheet S. A sheet severing knife assembly, generally designated 30, as provided at the sheet severing station 27 for cutting the sheet into strips s of scrap after the articles A are trimmed from the sheet S. A sheet indexing drive assembly, generally designated 32, is provided for intermittently downwardly indexing the sheet S and driving the trim die members 28 and sheet severing knife assembly 30 in timed relation. Article receiver apparatus, generally designated 31, is provided for receiving the articles A in nested relation after they have been severed from the sheet S.

THE SHEET SUPPLY

The sheet supply apparatus 24 (FIGS. 1, 2, and 3) includes a pair of laterally spaced, upstanding frame posts 34 mounted on the side rails 14. The posts 34 are spanned by upper and lower crossbars 36 which mount a generally planar, vertical, sheet guide plate 38 against which the sheet S bears as it moves downwardly in a vertical path. Apparatus is provided for intermittently downwardly indexing the sheet S along the sheet guide plate 38 and includes a pair of vertical, sheet guide rods 40 depending from the upper cross bar 36. Guide sleeves 43, slidably mounted on the guide rods 40, are spanned by a bar 44 having a pair of resilient, yieldable sheet engaging fingers 46 mounted thereon. The fingers 46, which may typically comprise spring steel, include terminal edges 48 which bear against the upper side u (FIG. 7) of a pair of the articles A formed in the sheet S to move the sheet S downwardly as the sleeves 43, bar 44, and fingers 46 move downwardly in a manner to become immediately apparent.

Apparatus is provided for moving the sleeves 43, finger mounting crossbar 44 and sheet engaging fingers 46 upwardly and downwardly and includes a yoke 50 which is fixed to the finger mounting crossbar 44. The yoke 50 is pivotally coupled via a pin 51 to one end of a drive arm 52 which is journaled, at its opposite end on a pin 53 provided on a crank 54 which is fixed to a shaft 56 journaled in bearing blocks 58 mounted on the upper crossbar 36. A drive sprocket 60, fixed to the shaft 56, is driven via a timing belt or chain 62. As the crank 54 rotates, the finger mounting crossbar 44 and sheet engaging fingers 46 are moved in a vertical path between raised positions, illustrated in chain lines in FIG. 2 and lowered positions illustrated in solid lines in FIG. 2. As the sheet engaging fingers 46 move downwardly, the terminal, finger edges 48 will engage the upper sides u of two articles A to move the sheet S downwardly along the sheet guide backing plate 38 to successively index the sheet S to the trim die station 26 and thence to the sheet severing station 27. As the sheet engaging fingers 46 move upwardly, the fingers 46 will merely escape or slide along the surface of sheet S which remains in the position to which it was previously advanced by the fingers 46. As the fingers 46 move, upwardly over the superjacent articles A formed in the sheet S, the finger 46 will be forced outwardly away from the sheet against the resilient force of spring steel. As soon as the terminal ends 48 of the fingers 46 clear the upper edges u, the terminal edges 48 will be forced inwardly into bearing engagement with the surface of sheet S. If desired, clamping bars (not shown) may be mounted on the frame F to aid in securing the sheet S in bearing, sliding engagement against the plate 38.

THE PRIMARY TRIM DIE ASSEMBLY

Figure 1:
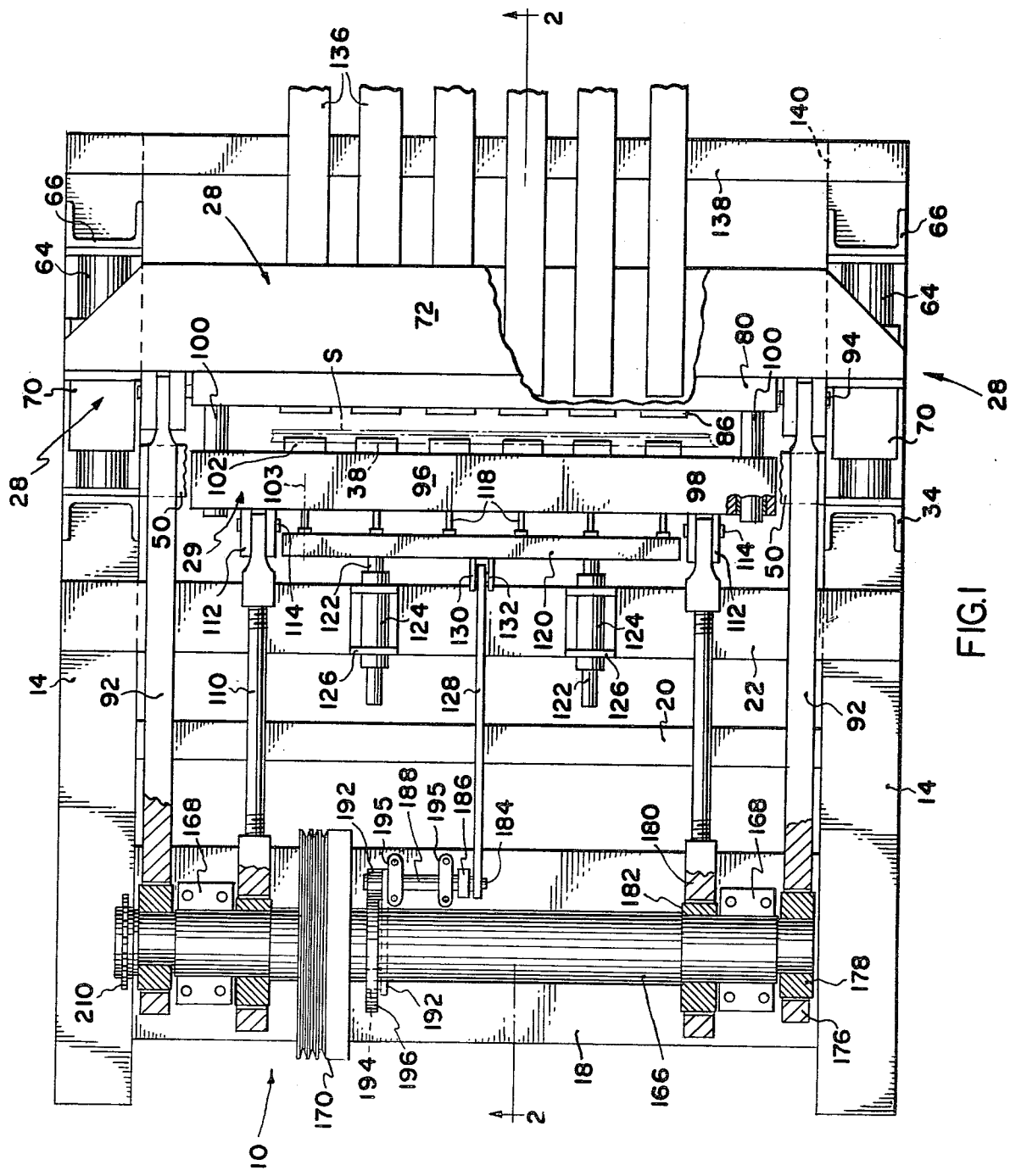
FIG. 1 is a top plan view of apparatus constructed according to the present invention, part of one of the trim die members being broken away to more particularly illustrate the receiver tubes, which receive the severed articles, and other parts being broken away in section to better illustrate the drive apparatus.
Figure 2:
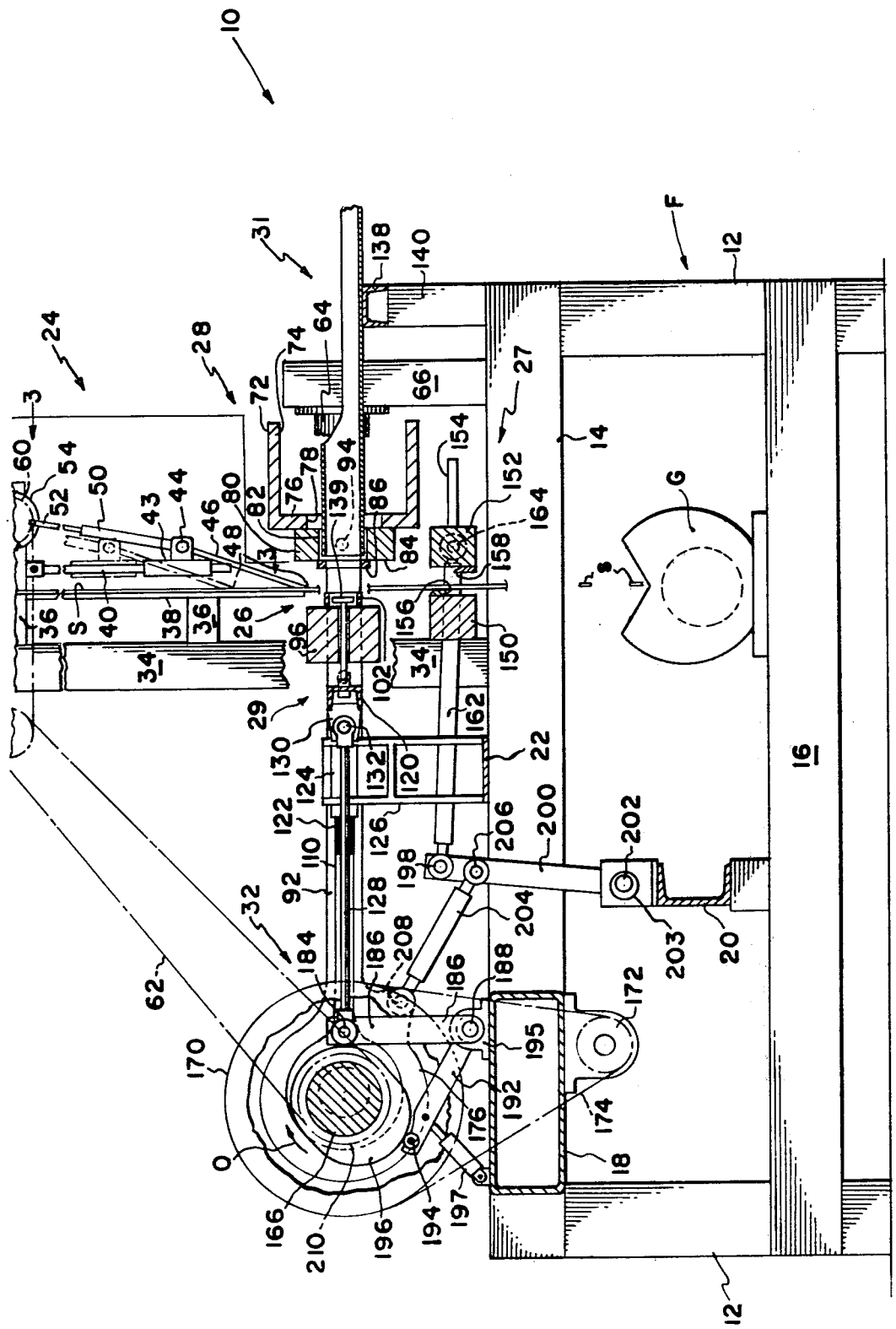
FIG. 2 is a sectional, side elevational view, taken along the line 2—2 of FIG. 1.

The primary trim die assembly, generally designated 28, is mounted on laterally spaced apart, horizontal, guide rods 64 spanning the upstanding frame posts 34 and laterally spaced upstanding stub posts 66 (FIG. 1) mounted on the upper siderails 14. The trim die assembly 28 includes a primary platen, generally designated 72, having guide sleeves 70 slidably, reciprocably mounted on the guide rods 64. The primary die platen 72 is generally U-shaped in cross-section, as illustrated in FIG. 2, and includes upper and lower generally parallel flange members 74 spanned by a generally vertical base 76 having a laterally extending, elongate slot opening or aperture 78 therethrough. Mounted on the base 76 of the primary platen 72 is a primary trim die 80 including a plurality of laterally spaced apart apertures 82 therethrough in alignment with the slot 78. The apertures 82 are spaced apart a distance equal to the distance between the centerlines c (FIG. 7) of the adjacent articles A formed in the sheet S. Mounted on the outer face 84 of the primary die 80 in alignment with each of the apertures 82 is a hollow, generally cylindrical, primary trim die knife 86 having an annular knife edge 88 for engaging one side of the sheet S along the circumferential border b (FIG. 7) of an article A provided in the sheet S. The trim die knife 86 includes a cylindrical passage 90 therethrough which, along with the platen aperture 78, receives the article A as it is being trimmed from the sheet S. The primary die assembly 28 is moved in a to-and-fro path of travel on the guide rods 64 via two laterally spaced crank arms 92 which are pivotally connected to the primary die platen 72 via pins 94 (FIG. 1) and driven in a manner to be more particularly described hereinafter.

THE SECONDARY TRIM DIE ASSEMBLY

The secondary trim die assembly 29 includes a secondary platen 96 having bushings 98 (FIG. 1) therethrough slidably mounted on horizontal guide rods 100 projecting horizontally from the primary die member 80. The secondary platen 96 mounts a plurality of secondary, hollow, cylindrical trim die punches 102 having axes 103 axially aligned with the axes 104 of the primary trim die knives 86. The secondary trim die punches 102 are mounted on the face of the secondary platen 96 via mounting brackets 106. The secondary trim die punches 102 each comprise a generally hollow cylinder having an annular knife edge 108 which bears against the opposite side of the sheet S and are received in sliding engagement by primary, cylindrical die knives 86 after the article A is severed from the sheet S. The secondary die platen 96 is moved in a to-and-fro path relative to the primary die platen 72 via a pair of laterally spaced, drive crank arms 110 pivotally connected to the secondary die member 96 via brackets 112 and pins 114 (FIG. 1).

The secondary die platen 96 includes a plurality of reduced diameter apertures 116 therethrough, in axial alignment with the secondary cutting knives, receiving a plurality of ejector pins 118 which are fixed to an ejector pin mounting member or channel 120. The ejector pin mounting channel is mounted on two guide rods 122 which are slidably received in two sleeves 124 mounted on upstanding posts 126 that are fixed to the transverse frame member 22. The ejector pin mounting member 120 and ejector pins 118 are concurrently movable relative to the secondary die member 96 via a crank arm 128 pivotally connected to the ejector pin mounting member 120 via a bracket 130 and a pivot pin 132. The terminal ends of the ejector pins 118 mount ejector plates 134 (FIGS. 4 and 5) which are received by the secondary cylindrical die knives 102. After the articles A are severed from the sheet S by the cooperating die knife members 86 and punches 102, the ejector pins 118 are moved, via crank arm 128, relative to the second platen 96, from the positions illustrated in solid lines in FIG. 4 to the positions illustrated in solid lines in FIG. 5 to move the articles A axially through the primary die knife openings 90 and the die openings 82 provided in the primary trim die 80.

THE RECEIVER ASSEMBLY

Figure 5:
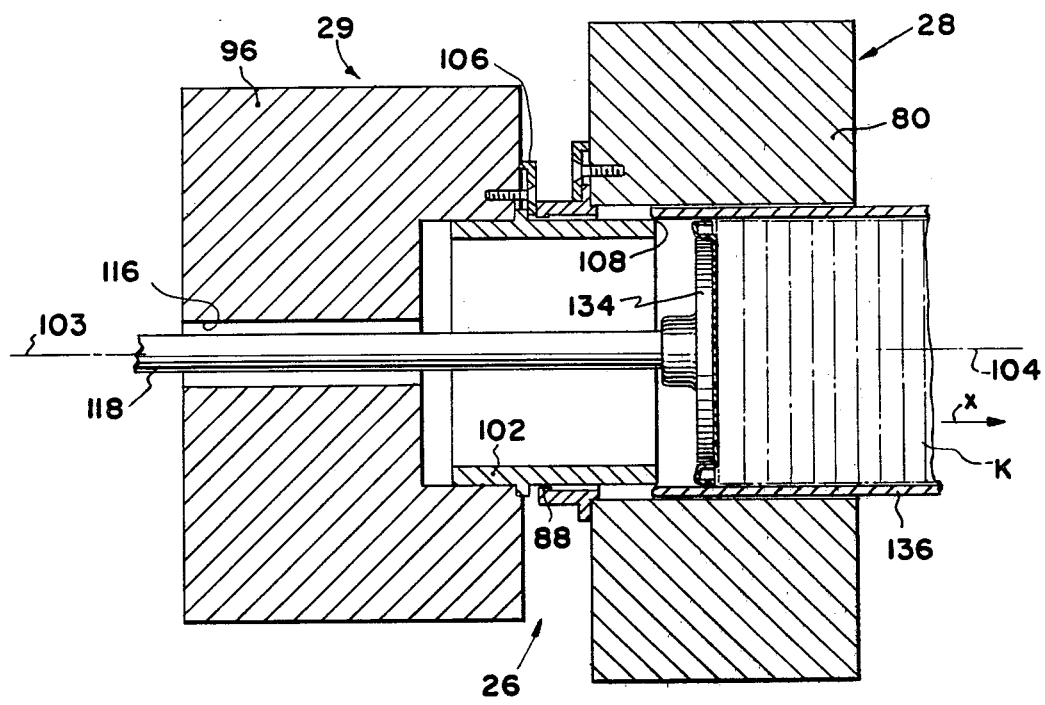
FIG. 5 is an enlarged side elevational view, similar to FIG. 4, illustrating the die members in adjusted positions in which an article has been trimmed from the sheet and moved into n, the receiver assembly.

The article receiving apparatus 31 includes a plurality of generally cylindrical, hollow collector or receiver tubes 136 freely received in the passages 82 provided in the primary die member 80 to allow the primary trim die 80 to move freely relative to the receiver tubes 136. The tubes 136 are stationarily mounted on a transversely extending frame member 138 spanning laterally spaced apart posts 140 supported by the frame members 14. The stroke of the ejector pins 118 is of such length that the ejector plates 134 move the severed articles A into the collector tubes 136, as illustrated in FIG. 5, to nest the severed articles A in stacked relation with previously severed articles A and incrementally indexes the stacks K thus formed axially downstream in the direction of the arrow x, along the receiver tubes 136.

After the articles A are severed from the sheet S and the primary and secondary die assemblies 28 & 29 are moved to the spaced apart positions illustrated in FIG. 2, the feed assembly 24 will index the sheet S downwardly to align another set of articles A with the trim knives 86, 102 at the trim station 26.

THE SHEET SEVERING ASSEMBLY

The sheet severing knife assembly 30 includes a stationary die member or anvil 150 spanning the upstanding posts 34, at a level below the trim die assembly 28, and a movable cutting knife 152 slidably mounted on frame supported guide rods 154. The knife 152 is movable in a to-and-fro path via a pair of laterally spaced crank arms 162 pivotally coupled to the die member 152 via pivot pins 164. The die member or anvil 150 and sheet cutting knife 152 include cooperating linear knife edges 156 and 158, respectively, which engage opposite sides of the sheet S to sever the terminal strip portion s from the remainder of the sheet S. A grinder, schematically designated G, is mounted below the sheet severing station 27 to receive and grind the waste strips s for recycling.

THE DRIVE ASSEMBLY

The drive assembly 32 is provided for operating the sheet supply mechanism 24, trim die assemblies 28, 29, and sheet severing knife assembly 30 in timed relation and includes a transverse shaft 166 journalled in bearings 168 mounted on the frame member 18. The shaft 166 mounts a drive pulley 170 (FIG. 1) drivingly coupled to an electrically energized drive motor 172 (FIG. 2) via a belt 174. The crank arms 92 for moving the primary die assembly 28, including primary platen 72, are coupled to sleeves 176 journalled on eccentric cams 178 fixed to the outer ends of the shaft 166. As the shaft 166 and eccentric cams 178 rotate, the crank arms 92 will move the primary plate 72 in a to-and-fro axial path of travel on the guide rods 64.

The crank arms 110 for moving the secondary die assembly 29, including the secondary die platen 96 relative to the primary platen 72 are coupled to sleeves 180 journalled on eccentric cams 182 fixed to the shaft 166. The eccentric cams 178 and 182 are constructed such that the die assemblies 28, 29 will concurrently move in opposite directions toward and away from each other and opposite sides of the plastic sheet S.

The crank arm 128 for moving the ejector pins 118, relative to the trim die assemblies 28 and 29 is pivotally connected, via a pin 184, to the upper end of a crank arm 186 which is fixed to a shaft 188 journalled in bearing blocks 195 mounted on the frame member 18. The opposite end of the shaft 188 is fixed to a cam follower arm 192 mounting a cam follower roller 194 which bears against a cam 196 fixed to the drive shaft 166. A fluid operated cylinder and piston 197 is coupled between the frame F and the follower arm 192 to urge the follower roller 194 against the cam 196. As the shaft 166 rotates in the direction of arrow 0, the crank arm 128 and ejector pins 118 will move in timed relation with the movement of the secondary die member 96 so that the ejector plates 134 will remain in the positions illustrated in solid lines in FIG. 4 until such time as the articles A have been severed from the sheet S. At that time, the cam follower roller 194 will move along the "high side" of the cam 196 causing the ejector pins 118 and ejector plates 134 to move from the positions illustrated in solid lines in FIG. 4 to the positions illustrated in solid lines in FIG. 5 to axially move the articles A downstream into the receiver tubes 136.

The crank arms 162 for moving the sheet cutting knife 152 is coupled via pivot pins 198 to the upper ends of crank arms 200 mounting pivot pins 202 journalled in frame mounted bearing blocks 203. The crank arms 200 are each moved in a to-and-fro rocking path of travel by a coupling member 204 which is pivotally connected to the crank arm 200 via a pivot pin 206 and pivotally connected to one of the sleeves 176 via a pivot pin 208. As illustrated in FIG. 2, the arm 204 is angularly displaced relative to the crank arm 92 at an angle of approximately 30° so that the movement of a primary die platen 72 and secondary die platen 96 precede the movement of the cutting knife 152 by approximately 30°, thus, movement of the knife edge 152 follows movement of the primary and secondary die members 72, 96. In this manner, the knife 152 does not engage the sheet S to cut the terminal strip s from the balance of the sheet S into scrap until a predetermined time after the articles A at trim station 26 have been severed from the sheet S. The timing belt 62 is trained around a sprocket 210, which is fixed to the drive shaft 166 so that the feed assembly 24 operates in timed relation with the die assembly 28, the knife assembly 30, and the ejector pins 118.

The dynamic balancing of the primary and secondary die assemblies is accomplished by setting the stroke of the primary and secondary die assemblies 28 and 29 in proportion to the weights thereof. The strokes of the primary and secondary die assemblies 28 and 29 are proportionate to the square root of the weights of the secondary and primary die assemblies 28 and 29 respectively. In a typical example, if the weight of the primary platen is 2¼ times as heavy as the weight of the secondary platens, the strokes of the primary and secondary die asemblies 28 and 29 will be 1 and 1.5 inches respectively. The inertial energy of the die assemblies is thus equal and will cancel the effect of the other to impose vibration. By moving both die assemblies 28 and 29 the speed of operation is not limited except by the speed at which the sheet S can be introduced to the trim station 26.

THE OPERATION

Figure 4:
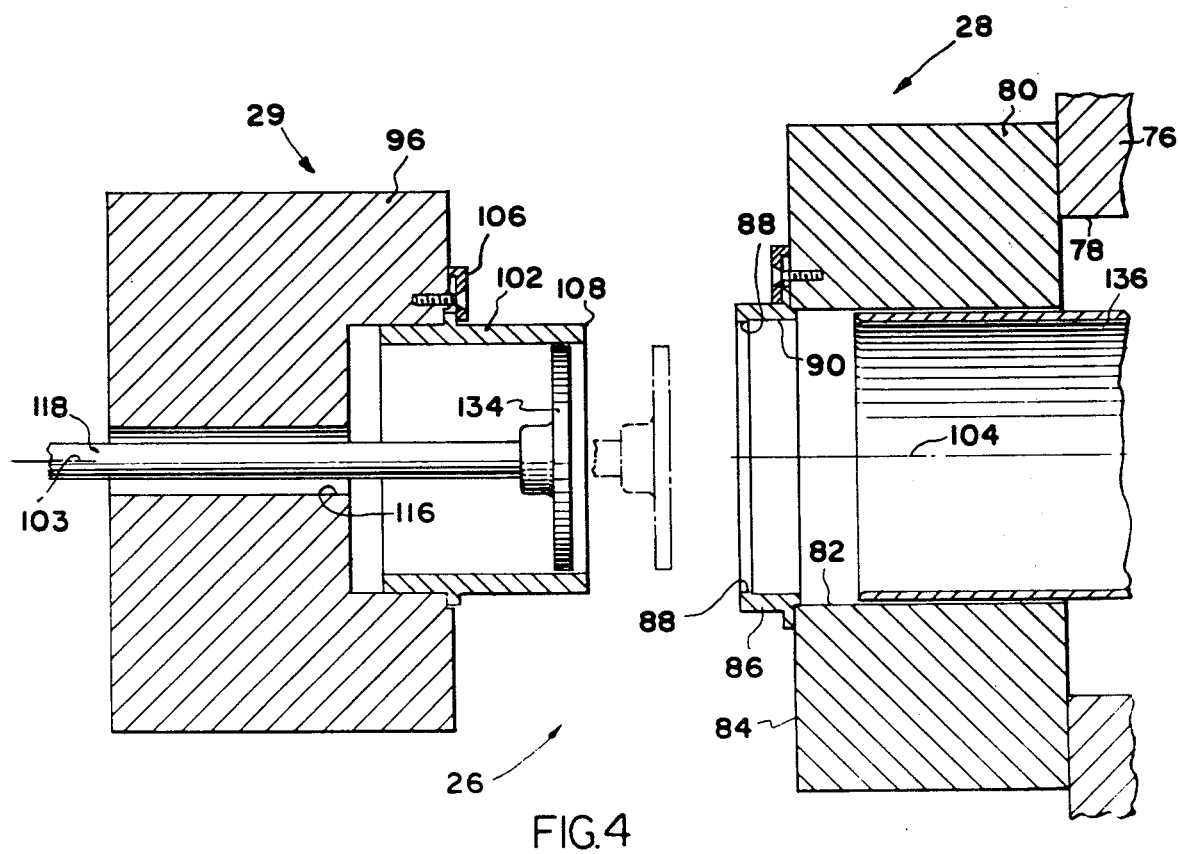
FIG. 4 is a greatly enlarged, sectional side view, more particularly illustrating the die members in spaced apart positions.

A thermoplastic sheet S having a plurality of laterally and longitudinally spaced articles A thermoformed therein is vertically downwardly fed into the machine along the backing plate 38. It will be assumed that the feed assembly 24 has been operated to move the sheets downwardly to a position in which articles A are axially aligned with the die knife members 86 and punches 102 at the trim die station 26. At this time, the primary and secondary die assemblies are in their spaced apart positions as illustrated in FIG. 4. As the drive assembly 32 continues to operate, the primary die knives 86 and secondary punches 102, along with the primary and secondary die assemblies 28 and 29, mounting will be driven toward each other to engage opposite sides of the sheet S and then sever the sheet along the borders b to separate the articles A, positioned at the trim station 26, from the sheet S. The drive assembly 32 will continue to operate to move the primary die knives 86 and secondary punches 102 toward each other until the male, secondary die punches 102 are received within the cylindrical female, primary die knife member 96 in the positions illustrated in FIG. 5. The ejector pins 116 will then move from the position illustrated in solid lines in FIG. 4 to the positions illustrated in solid lines in FIG. 5 to move the severed articles A at trim station 26 into the receiver tubes 136 where they are nested with any similarly severed articles A previously moved into the receiver tubes 136 to form stacks K. The parts A will be frictionally received and retained by the tubes 136 to maintain the trimmed articles A generally perpendicular to the axis 104 after the ejector pins 118 are retracted.

The die members 86 and punches 102 are then driven in directions away from each other to the positions illustrated in solid lines in FIG. 2. The feed assembly 24 will then be operated in timed relation to index the sheet S downwardly to align the next succeeding set of articles A with the now separated die knife members 86, 102. The operation will continue to be repeated.

After a predetermined number of articles have been severed from the sheet S, the lower terminal end of the sheet S will be positioned at the sheet severing station 27. Momentarily after articles A have been severed from the sheet S, the lower terminal portion of the sheet S, which has been previously trimmed at the trim station 26, is engaged by the knife edges 156, 158 at sheet severing station 27 to sever the terminal end portion s of the sheet S from the remainder of the sheet.

It is to be understood that the drawings and descriptive matters are in all cases to be interpreted as merely illustrative of the principles of the invention, rather than as limiting the same in any way, since it is contemplated that various changes may be made in various elements to achieve like results without departing from the spirit of the invention or the scope of the appended claims.

What I claim is:

1. Trim apparatus for severing articles which have been differentially pressure-formed in a thermoplastic sheet from the thermoplastic sheet comprising:

a frame;

means on said frame for successively indexing a continuous thermoplastic sheet having articles formed therein downstream to a trim station;

a pair of dynamically balanced trim platens, including a pair of trim dies, mounted on said frame for movement between spaced apart positions and closed positions in which said trim dies engage opposite sides of said sheet to sever an article at said trim station from said sheet;

one of said platens including an opening therethrough for receiving the article as it is being trimmed and for passing the article after it is trimmed;

one of said trim dies comprising a female due having a passage therethrough in alignment with said opening for receiving said article as it is being trimmed and for passing said article;

article receiver means, stationarily mounted on said frame and received by said opening for receiving the articles from said female trim die and said one platen;

ejector means, mounted on the other of said platens for movement relative thereto, for moving the article through said die passage to said receiver means after said article is severed from said sheet;

first and second opposing sheet severing means mounted on said frame, downstream of said trim station, for to-and-fro relative movement toward and away from each other between positions in which at least one of said sheet severing means is spaced from a portion of the sheet downstream of the trim station and positions in which said first and second sheet severing means engage opposite sides of said sheet to sever the terminal end portion of said sheet from the remainder of the sheet; and means for moving said sheet severing means in timed relation with movement of said trim die members to sever the terminal portion of said sheet a predetermined time after said trim die members engage the sheet at the trim station.

2. The apparatus set forth in claim 1 wherein said sheet indexing means includes means for engaging said sheet and me for moving said sheet engaging means in a to-and-fro path of travel.

3. The apparatus set forth in claim 1 wherein said receiver means comprises elongate tube means, the other of said dies comprising a male trim die including an opening therethrough, said ejector means being mounted in the opening in said male trim die for movement relative thereto to move said part into said elongate tube means.

4. The apparatus set forth in claim 1 wherein said indexing means includes means for vertically moving said sheet of plastic.

5. The apparatus set forth in claim 1 wherein said stack receiver means comprises hollow tubular means; said ejector means comprising means for moving the severed article into said tubular means into nested, stacked relation with previously severed articles.

6. A trim assembly comprising:
a frame;
means for successively indexing a thermoplastic sheet having a plurality of articles differentially pressure formed therein to a trim station and thence to a sheet severing station downstream of said trim station;
a pair of dynamically balanced trim die members mounted on said frame for to-and-fro concurrent movement in opposite directions between spread positions and closed positions to engage opposite sides of said sheet and sever an article at the trim station from said sheet;
sheet severing means, at said severing station, for severing the terminal end portion of said sheet from the balance of the sheet; and
means operating said sheet severing means in timed relation with the operation of said trim die means to sever said terminal downstream end portion of said sheet from the balance of said sheet a predetermined time after said trim die members reach said closed positions and said article is severed from the sheet at said trim station.

7. The trim assembly set forth in claim 6 wherein receiver means is mounted on said frame for receiving articles in stacked relation from one of said trim die members when said articles are severed from said sheet.

8. The trim assembly set forth in claim 7 including ejector means for moving severed articles downstream into nesting relation with previously severed articles and to index the previously severed articles downstream.

* * * * *